(12) United States Patent
Ramesh et al.

(10) Patent No.: US 9,197,246 B2
(45) Date of Patent: *Nov. 24, 2015

(54) ITERATIVE DECODING OF BLOCKS WITH CYCLIC REDUNDANCY CHECKS

(71) Applicant: Optis Cellular Technology, LLC, Plano, TX (US)

(72) Inventors: Rajaram Ramesh, Raleigh, NC (US); Havish Koorapaty, Saratoga, CA (US); Jung-Fu Cheng, Fremont, CA (US); Kumar Balachandran, Pleasanton, CA (US)

(73) Assignee: Optis Cellular Technology, LLC, Plano, TX (US)

( * ) Notice: Subject to any disclaimer, the term of this patent is extended or adjusted under 35 U.S.C. 154(b) by 183 days.

This patent is subject to a terminal disclaimer.

(21) Appl. No.: 13/956,136

(22) Filed: Jul. 31, 2013

(65) Prior Publication Data

US 2013/0311858 A1 Nov. 21, 2013

Related U.S. Application Data

(60) Continuation of application No. 13/281,291, filed on Oct. 25, 2011, now Pat. No. 8,527,843, which is a division of application No. 12/234,067, filed on Sep. 19, 2008.

(60) Provisional application No. 60/973,500, filed on Sep. 19, 2007.

(51) Int. Cl.
*H03M 13/00* (2006.01)
*H03M 13/09* (2006.01)
(Continued)

(52) U.S. Cl.
CPC ........ *H03M 13/093* (2013.01); *H03M 13/2948* (2013.01); *H03M 13/2975* (2013.01);
(Continued)

(58) Field of Classification Search
CPC .................. H03M 13/2948; H03M 13/2951; H03M 13/3753
See application file for complete search history.

(56) References Cited

U.S. PATENT DOCUMENTS 6,182,261 B1 * 1/2001 Haller et al. .................. 714/758
7,093,180 B2 * 8/2006 Shin et al. ..................... 714/755
(Continued)

FOREIGN PATENT DOCUMENTS

WO WO 02/30004 A2 4/2002

OTHER PUBLICATIONS

Matache, et al. 'Stopping Rules for Turbo Decoders'; published in the NASA JPL TMO Progress Report 42-142; Aug. 15, 2000; pp. 1-22.
(Continued)

*Primary Examiner* — Mujtaba K Chaudry

(57) ABSTRACT

The iterative decoding of blocks may be continued or terminated based on CRC checks. In an example embodiment, one iteration of an iterative decoding process is performed on a block whose information bits are covered by a CRC. The iterative decoding process is stopped if the CRC checks for a predetermined number of consecutive iterations. In another example embodiment, a decoding iteration is performed on a particular sub-block of multiple sub-blocks of a transport block, which includes a single CRC over an entirety of the transport block. The CRC is checked using decoded bits obtained from the decoding iteration on the particular sub-block and decoded bits obtained from previous decoding iterations on other sub-blocks of the multiple sub-blocks. The decoding iteration is then performed on a different sub-block if the CRC does not check. Also, the decoding iterations for the sub-blocks may be terminated if the CRC checks.

21 Claims, 9 Drawing Sheets

400

(51) Int. Cl.
  *H03M 13/29* (2006.01)
  *H04L 1/00* (2006.01)
  *H04L 1/18* (2006.01)
  *H03M 13/37* (2006.01)

(52) U.S. Cl.
  CPC ......... *H03M13/6525* (2013.01); *H04L 1/0051* (2013.01); *H04L 1/0061* (2013.01); *H04L 1/0083* (2013.01); *H04L 1/18* (2013.01); *H03M 13/09* (2013.01); *H03M 13/2951* (2013.01); *H03M 13/3753* (2013.01)

(56) References Cited

U.S. PATENT DOCUMENTS

| | | | | |
|---|---|---|---|---|
| 7,467,345 | B2 * | 12/2008 | Shin et al. | 714/755 |
| 8,332,717 | B2 * | 12/2012 | Eudes | 714/758 |
| 2001/0052104 | A1 * | 12/2001 | Xu et al. | 714/792 |
| 2003/0066018 | A1 * | 4/2003 | Yu et al. | 714/792 |
| 2005/0204255 | A1 * | 9/2005 | Yeh et al. | 714/755 |
| 2007/0165566 | A1 * | 7/2007 | Khan et al. | 370/329 |
| 2007/0168830 | A1 * | 7/2007 | Shin et al. | 714/755 |
| 2008/0301523 | A1 * | 12/2008 | Eudes | 714/758 |

OTHER PUBLICATIONS

Ericsson. Turbo Decoding Resource Budgeting. R1-0797403GPP. TSG-RAN WGI350 XP050107329, Athens, Greece, Aug. 20-24, 2007, entire document.

International Preliminary Report on Patentability, Application No. PCT/IB2009/006856, mailed Mar. 31, 2011, 8 pages.

International Search Report and Written Opinion, Application No. PCT/IB2009/006856, mailed Mar. 5, 2010, 15 pages.

Nortel, "FEC Code Block-based CRC", R1-073310, 3GPP TSG-RAN WG1, Meeting 50, Athens, Greece, Aug. 20-24, 2007, 4 pages.

* cited by examiner

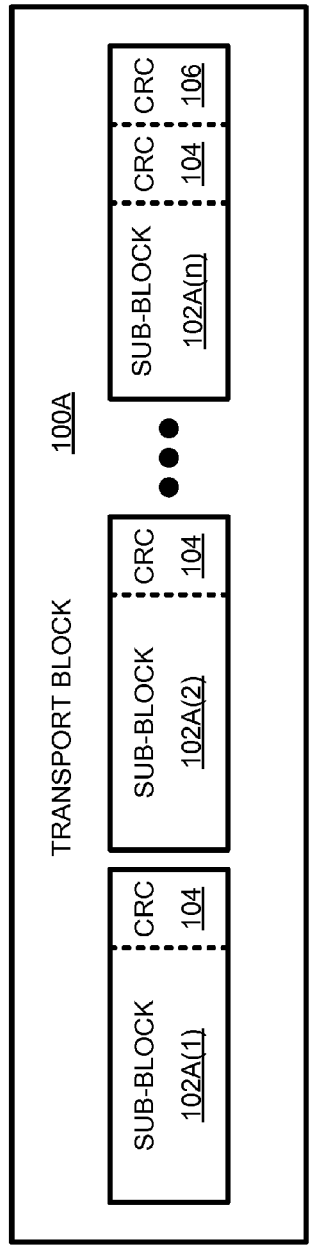
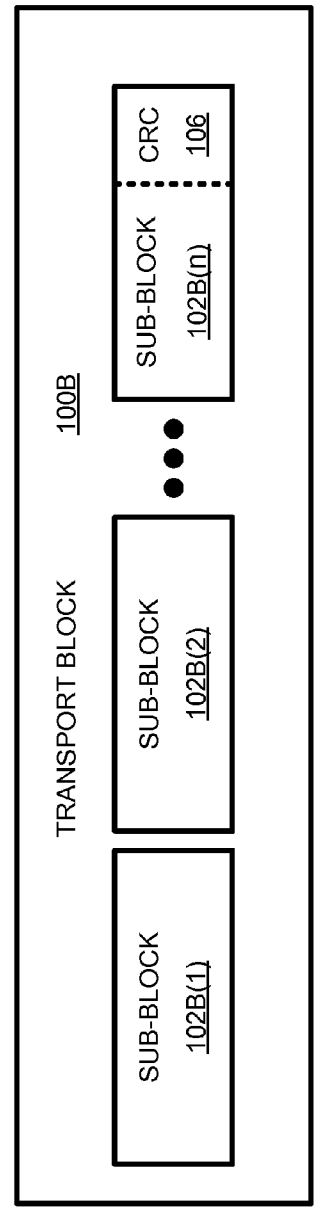

ITERATIVE DECODING OF BLOCKS WITH CYCLIC REDUNDANCY CHECKS

CROSS-REFERENCE TO RELATED APPLICATIONS

This application is a continuation of U.S. patent application Ser. No. 13/281,291, filed on Oct. 25, 2011, which is a divisional of U.S. application Ser. No. 12/234,067, filed on Sep. 19, 2008, which claims the benefit of priority from U.S. Provisional Patent Application No. 60/973,500, filed on Sep. 19, 2007, and entitled "Method and Arrangement in a Telecommunication System".

TECHNICAL FIELD

The present invention relates generally to communications systems, and in particular to complexity reduction for iterative decoders using CRC checking.

BACKGROUND

Many specialized terms and abbreviations are used in the communications arts. At least some of the following are referred to within the text that follows, such as in this background and/or the description sections. Thus, the following terms and abbreviations are herewith defined:
  3GPP 3rd Generation Partnership Project
  CRC Cyclic Redundancy Check
  E-UTRAN Evolved UTRAN
  LTE Long Term Evolution
  UMTS Universal Mobile Telecommunications System
  UTRA Universal Terrestrial Radio Access
  UTRAN UMTS Terrestrial Radio Access Network
  WiMAX Worldwide Interoperability for Microwave Access Telecommunication forms the backbone of today's information-oriented society and may be carried out using wired or wireless transmission and reception. The capacity of a communication channel is typically limited by the bandwidth. The bandwidth of a communication channel is in turn limited by natural and artificial limits imposed by, for example, the properties of the medium, the spectrum allocated for communication by design constraints, and regulatory authorities or operators.

The utilization of a communications channel, even given a finite allocation of the electromagnetic spectrum, may be increased by adopting any of a number of different schemes. These schemes enable more information to be communicated in a given spectrum allocation. Efficient utilization of spectrum can reduce the cost of communication services being provided, can enable richer communication services to be provided, or both.

An example communication scheme involves the coding of information. Information is encoded at a transmitting device, and the encoded information is transmitted via a channel. The transmitted encoded information propagates through the channel and is decoded at a receiving device to recover at least a semblance of the original information. With appropriate coding, information may be compressed and/or made more resilient to interference in the communications channel. In other words, coding schemes may be employed to increase the efficient utilization of electromagnetic spectrum.

Practical channel codes that achieve performance close to capacity are now widely in use in current wireless communication standards or planned for future ones. Examples of such codes are the turbo codes used in the UTRAN, E-UTRAN, and WiMAX systems. The optimal decoder for such codes is impractical to implement. Consequently, sub-optimal iterative decoders are used. Such decoders are known to nonetheless approach optimal performance for practical operation ranges. These decoders typically require many iterations, with the complexity of the decoder increasing proportionally with the number of iterations employed to achieve a target residual frame error rate.

In mobile wireless communication systems, for example, such decoders are implemented in mobile terminals with size, processing power, and cost constraints. When the system supports high data rates, the required decoder complexity places a burden on the limited resources of a mobile terminal. Such complexity constraints also affect the base station where the signals for many users may have to be decoded concurrently. Furthermore, such a system may use transport block segmentation in which a larger transport block is segmented into multiple smaller code sub-blocks. The sub-blocks are decoded before the transport block can be fully decoded.

It is therefore of interest to reduce the complexity of the iterative decoder while also attempting to maintain a desired level of performance. One such method for reducing complexity involves dynamically reducing the number of decoding iterations employed based on the codeword received. Numerous stopping rules for reducing the number of iterations to less than a predefined maximum have been described in the prior art.

A stopping rule for reducing the number of decoding iterations provides some criterion that, when met, can indicate with a relative and/or acceptably high degree of confidence that the code block has been decoded successfully. When the criterion outlined by the stopping rule is met, the decoding process is stopped. Typically, the number of iterations used for decoding different code blocks may directly or indirectly depend on the signal-to-noise ratio of the received signal. Indeed, it would be beneficial for the decoder to increase the amount of effort needed to make a decoding decision as the signal-to-noise ratio of the received signal decreases.

Many classes of codes in use, such as turbo codes, can map the effort to be employed directly to the number of iterations used by the decoder. Given a target frame error rate that is to be met, the use of a stopping rule can reduce the average number of iterations involved in the decoding as compared to an algorithm that simply uses a fixed number of iterations.

Thus, a stopping rule can be used to curtail the number of iterations performed by an iterative turbo decoder. These rules can be classified broadly into hard decision rules, soft decision rules, and a CRC rule. Hard decision rules are based on the lack of changes in bit decisions between iterations. Soft decision rules are based on comparing a metric, which is derived from the soft bit reliability values generated after an iteration, with a threshold.

The CRC rule relies on the absence of detected error at the end of an iteration to decide if a decoded code block is correct. If the CRC indicates a lack of a code block error, decoding is stopped. The use of the CRC as a stopping criterion has been described in the following document: 'Stopping Rules for Turbo Decoders,' by Matache, Dolinar and Pollara, which was published in the NASA JPL TMO Progress Report 42-142, 15 Aug. 2000, and currently available at http://tmo.jpl.nasa.gov/progress_report/42-142/title.htm.

Regardless of the stopping rule used, a practical decoder sets a limit on the maximum number of decoding iterations (e.g., $I_{max}=8$). At the end of the last permitted iteration, the stopping rule can be used to determine if the code block was decoded successfully. However, the iterative decoding is then terminated regardless of whether the stopping rule has been met.

In a modern high-data-rate communication system, for example, a transport block can contain tens or even hundreds of thousand of bits. For practical reasons, a "large" transport block is thus segmented into multiple code sub-blocks, each of which is usually smaller than a predefined maximum size. For instance, in the LTE of the UMTS system (e.g., Technical Specification 3GPP TS 36.212 "Multiplexing and Channel Coding (Release 8)" issued by the 3rd Generation Partnership Project), the maximum code sub-block size is set to 6144 bits, and a CRC sequence is calculated and attached to each sub-block.

FIGS. 1A and 1B illustrate example code block segmentation schemes. Generally, each includes a transport block 100 that is segmented into multiple sub-blocks 102. CRC sequences 104 and/or 106 are included with each sub-block 102. More specifically, FIG. 1A illustrates an example code block segmentation and CRC attachment scheme in accordance with E-UTRAN. FIG. 1B illustrates an example code block segmentation and CRC attachment scheme in accordance with WiMAX/UTRA.

In FIG. 1A, transport block 100A includes "n" sub-blocks 102A (e.g., sub-block 102A(1), sub-block 102A(2) . . . sub-block 102A(n)), with "n" representing a positive integer. Each sub-block 102A includes and is associated with a CRC 104. CRCs 104 are termed inner CRCs. CRC 106 is termed an outer CRC. Outer CRC 106 may be included as part of one (or two or a few) sub-block 102A, but it is associated with multiple sub-blocks 102A, such as each of the sub-blocks 102A of transport block 100A. Thus, with the LTE of UTRA, each of sub-blocks 102A is protected by an inner CRC 104, and the overall transport block 100A is also protected by another check sequence, the outer CRC 106.

In FIG. 1B, transport block 100B includes "n" sub-blocks 102B (e.g., sub-block 102B(1), sub-block 102B(2) . . . sub-block 102B(n)), with "n" representing a positive integer. Transport block 100B includes and is associated with a CRC, such as outer CRC 106. Outer CRC 106 may be included as part of one of the sub-blocks, such as the last sub-block 102B(n). However, outer CRC 106 is associated with multiple sub-blocks 102B, such as each of the sub-blocks 102B of transport block 100B. Sub-block 102B(n) may also include padding bits. It should be noted that an outer CRC 106 may also be split between two or more sub-blocks 102.

Turbo coding is used in many wireless communication systems due to its performance capabilities. Typically, the total data block is split into many sub-blocks, each of which is coded separately using the turbo encoder. This splitting and separate coding is intended to trade-off memory and performance specifications of the turbo decoder. The turbo decoder operates in an iterative fashion—each iteration uses the results of the previous iteration as input and typically improves the reliability of the decoded sequence of bits.

Generally, a transport block containing multiple sub-blocks is decoded by decoding the component sub-blocks in the sequential order in which they form the transport block. If a sub-block is found to be correct, turbo decoding for that sub-block may be stopped, and the decoder may proceed to process the next sub-block. On the other hand, if a sub-block is found to be incorrect, decoding of the rest of the transport block can be aborted. The effect of either type of decoding termination can contribute to a reduction in the total amount of decoding resources employed.

Early stopping rules may be implemented to determine when decoding may be terminated prior to a maximum permitted number of iterations. There are two types of error events associated with early stopping rules: In a "miss event", an erroneous sub-block is declared as correct. In such an event, the receiver continues to decode the rest of the sub-blocks in the transport block, which results in an unnecessary increase in complexity. In a "false alarm event", a correctly-decoded sub-block is declared as being in error. This type of event is also troublesome. When one of the sub-blocks is declared incorrect, it is sensible to abort the decoding of the remainder of the sub-blocks. However, if such detection is unreliable, data throughput can be unnecessarily reduced, and the applied decoding resources are concomitantly increased.

When data throughput is reduced, the amount of data being communicated per user is reduced and/or the number of users that may be served at a given service level is reduced. When decoding resources are increased, especially with a mobile device, the level of complexity and amount of battery drain also increase. Existing stopping rules do not efficiently address these issues inasmuch as they are relatively complex.

Consequently, there is a need to address these deficiencies in the current state of the art. Such deficiencies and other needs are addressed by one or more of the various embodiments of the present invention.

SUMMARY

Example embodiments that are described herein entail methods of dynamically stopping decoding iterations so as to at least mitigate or ameliorate some of the disadvantages of conventional approaches. More specifically, example embodiments describe methods to reduce decoding complexity when decoding sub-blocks that collectively form a transport block.

It is an object of certain embodiment(s) of the present invention to provide robust CRC-based rules for stopping iterations of a decoding process.

It is another object of certain embodiment(s) of the present invention to reduce the complexity of decoding a transport block containing multiple sub-blocks.

It is yet another object of certain embodiment(s) of the present invention to reduce the complexity of turbo decoding by using a robust CRC check stopping rule to terminate an iterative decoding process.

In an example embodiment, there is a method for iterative decoding of a received block whose information bits are covered by a CRC. The method includes acts of performing a decoding iteration, checking a CRC, and stopping the decoding process if the CRC has checked for a predetermined number of consecutive iterations.

In another example embodiment, there is a method for decoding a transport block that includes multiple sub-blocks, each of which can be decoded iteratively. The transport block also includes a single CRC over an entirety of the transport block. A decoding iteration is performed on a particular sub-block of the multiple sub-blocks. The CRC for the entirety of the transport block is checked using decoded bits obtained from the decoding iteration on the particular sub-block and decoded bits obtained from previous decoding iterations on other sub-blocks of the multiple sub-blocks. The decoding iteration is then performed on a different sub-block if the CRC does not check. Alternatively, the decoding iterations for all of the sub-blocks of the multiple sub-blocks may be terminated if the CRC checks consecutively for a predetermined number of consecutive decoding iterations.

An advantage of certain embodiment(s) of the present invention is that the complexity of a mobile device, for example, may be reduced by enabling appropriately early termination of the iterative decoding of sub-blocks of a transport block with minimal impact on decoding performance.

Another advantage of certain embodiment(s) of the present invention is that faster operation of a, e.g., turbo decoding process may be achieved due to early termination. The early termination can enable lower chip area and power consumption.

Additional embodiments are described and/or claimed herein. Example additional embodiments include, by way of example but not limitation, methods, devices, arrangements, memory, systems, and so forth. Additional aspects of the invention are set forth in part in the detailed description, drawings, and claims that follow, and in part may be derived from the detailed description and drawings, or can be learned by practice of the invention. It is to be understood that both the foregoing general description and the following detailed description are exemplary and explanatory only and are not restrictive of the invention as disclosed or as claimed.

BRIEF DESCRIPTION OF THE DRAWINGS

A more complete understanding of the present invention may be obtained by reference to the following detailed description when taken in conjunction with the accompanying drawings wherein:

FIG. 1A illustrates an example code block segmentation and CRC attachment scheme in accordance with E-UTRAN.

FIG. 1B illustrates an example code block segmentation and CRC attachment scheme in accordance with WiMAX.

DETAILED DESCRIPTION

As described herein above, there can be both "miss events" and "false alarm events" caused by early stopping rules with iterative decoding. It is desirable to keep the probabilities for both the "miss event" and the "false alarm event" as low as is feasible in designing early stopping rules. "Miss event" probabilities are present in all three types of stopping rules: hard and soft decision rules as well as the CRC rule. However, the CRC rule has a distinctive advantage of exhibiting an essentially zero "false alarm event" probability.

It should be noted that, given the CRC attachment to a block, there are a multitude of ways to devise different stopping rules with different levels of reliability. A naïve approach might result in a floor on the code block error probabilities, which is ultimately undesirable. This is further exacerbated when a transport block is split into multiple sub-blocks with a stopping rule applied to the iterative decoding of each sub-block. It is a focus of certain described embodiments to avoid such a result.

Figure 2:
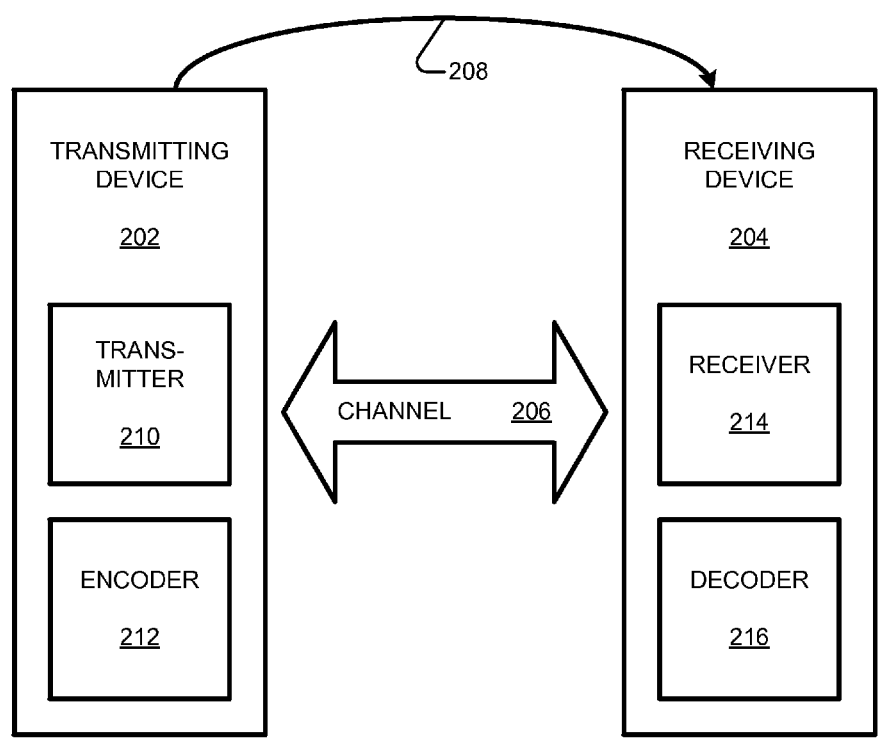
FIG. 2 is a block diagram of an example communications system including a transmitting device and a receiving device.

FIG. 2 is a block diagram of an example communications system 200 including a transmitting device 202 and a receiving device 204. As illustrated, communications system 200 operates over a channel 206 and includes a signal 208 in addition to transmitting device 202 and receiving device 204. Transmitting device 202 includes a transmitter 210 and an encoder 212. Receiving device 204 includes a receiver 214 and a decoder 216.

In an example operation, transmitting device 202 transmits a signal 208 over channel 206 to receiving device 204. Receiving device 204 receives signal 208 from transmitting device 202 via channel 206. More specifically, encoder 212 encodes information bits into a communication that is modulated and then transmitted by transmitter 210 as signal 208 over channel 206. At receiving device 204, signal 208 is received by receiver 214 and converted to baseband. Decoder 216 is adapted to decode the signal to recover the original information bits. An example composition of signal 208 is described herein below with particular reference to FIG. 3.

It should be understood that a single device may function as a transmitting device 202 at one moment and/or with respect to one communication and as a receiving device 204 at another moment and/or with respect to another communication. Examples of transmitting devices 202 and receiving devices 204 include, by way of example but not limitation, network communication nodes, remote terminals, and other devices that are capable of communicating over a channel 206. Network communication nodes may include, for example, a base transceiver station, a radio base station, a Node B, an access point, and so forth. Remote terminals may include, for example, a mobile terminal, a mobile station, a subscriber station, a communication card or module, and so forth. General example device implementations for transmitting/receiving devices 202/204 are described herein below with particular reference to FIG. 10.

Generally, channel 206 may be a wired channel or a wireless channel. Regardless, channel 206 affects the transmission, propagation, and/or reception of signal 208. For this and other reasons such as efficiency, signal 208 is encoded by encoder 212. The decoding is performed by decoder 216. An example iterative decoder embodiment is described herein below with particular reference to FIG. 4.

Figure 3:
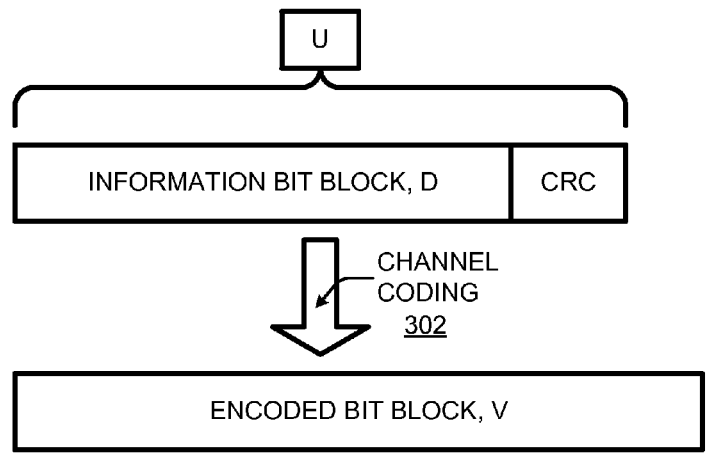
FIG. 3 illustrates an example composition of transmitted information.

FIG. 3 illustrates an example composition 300 of transmitted information. Composition 300 shows further details of example encoding operations performed at the transmitting device. Composition 300 includes an information bit block D, an associated CRC, and an encoded bit block V. The information bit block D and the associated CRC are jointly referred to as a concatenated block U. A channel coding operation 302 is also performed as part of the encoding operation.

For an example encoding operation, information bit block D is to be transmitted. A CRC is appended to the information bit block D to form the concatenated block U. The block U is encoded with channel coding operation 302 using encoder 212 (of FIG. 2). Channel coding operation generates the encoded block V. Block V is then modulated and transmitted to a receiving device having a decoder 216 (of FIGS. 2 and 4).

Figure 4:
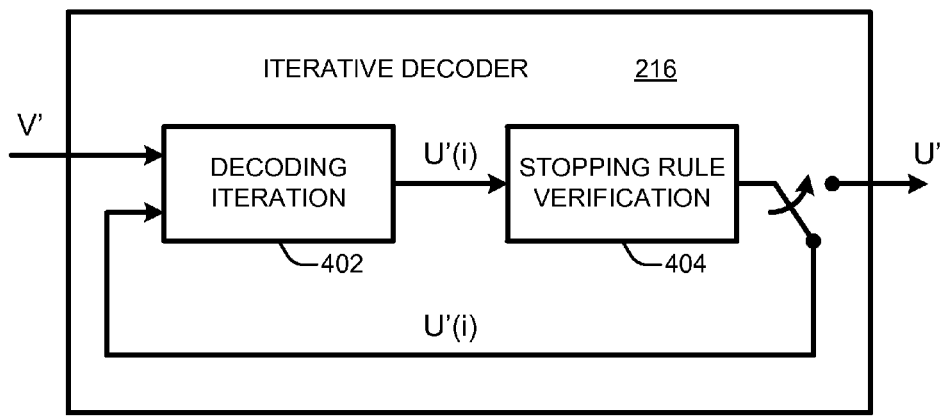
FIG. 4 illustrates an example structure for an iterative decoder.

FIG. 4 illustrates an example structure for an iterative decoder 216. As illustrated, iterative decoder 216 includes a decoding iteration 402 and a stopping rule verification 404. In an example operation generally, iterative decoder 216 accepts as input the received symbol block V' and produces as output estimate U'. As explained further herein below, multiple decoding iterations 402 may be performed as part of an iterative decoding process. The iterative decoding process may be continued or terminated based on whether a stopping rule is verified at stopping rule verification 404. Example embodiments employ stopping rules that entail checking CRCs over one or more iterations. The number of iterations, as well as the number of successful or failed CRC checks, may be monitored.

More specifically for iterative decoder 216, the hard or soft received symbol block, V', is accepted as input. The received symbol block V' corresponds to the encoded block V as input to iterative decoder 216. The high-level iterative structure of iterative decoder 216 is shown in FIG. 4. After each decoding iteration 402, a tentative estimate U'(i) of the block U is generated, where "i" signifies the ith iteration. Iterative decoder 216 eventually outputs estimate U', which includes the detected information bit block D', if the decoding is successful. Otherwise, it flags a block or frame error if the decoding is unsuccessful.

The decoding iteration block 402 may include one or more decoders. By way of example, decoding iteration block 402 may include at least one turbo decoder. With turbo decoding, two decoding operations are performed per decoding cycle. Each iteration of a turbo decoder may therefore be considered one or two decoding operations. In other words, each iteration may actually comprise one or two "sub-iterations" depending on the encoder structure. With turbo coding, two component encoders are used, so two decoding operations or sub-iterations are used, one for each component encoder. The stopping rule for the stopping rule verification block 404 may then be applied after each sub-iteration or after a full iteration including two sub-iterations.

Figure 5:
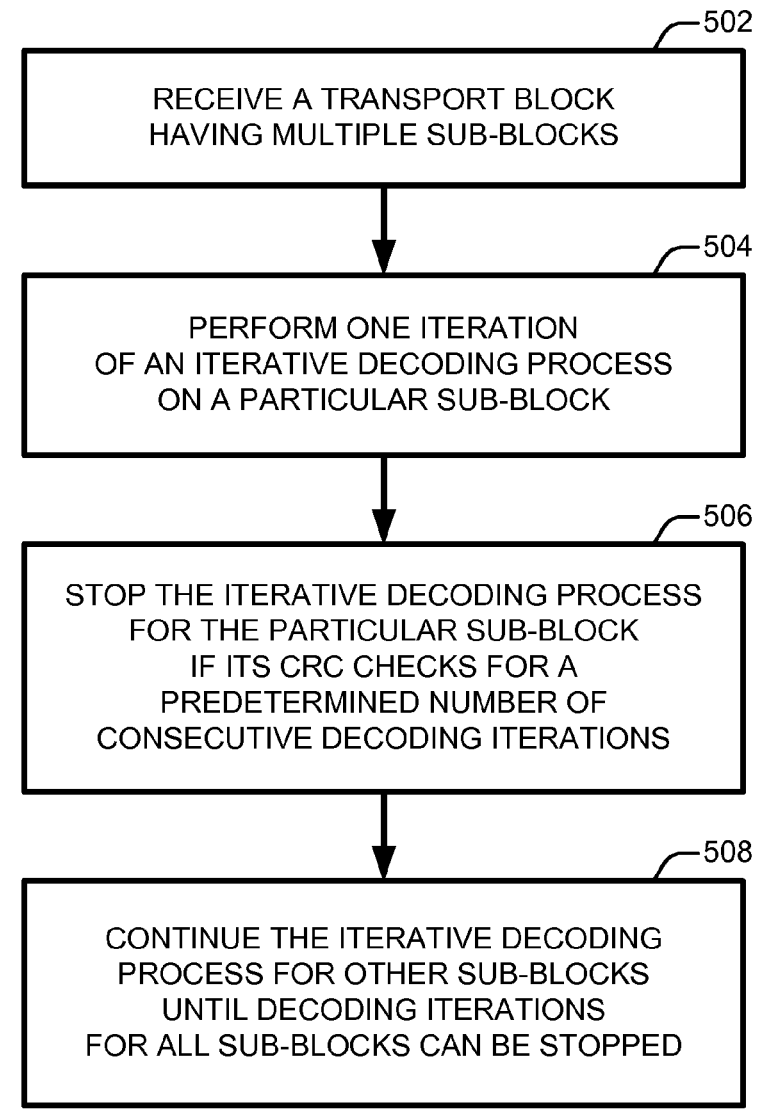
FIG. 5 is a flow diagram of an example general method for decoding a transport block that is constructed from multiple sub-blocks having associated CRCs.
Figure 6:
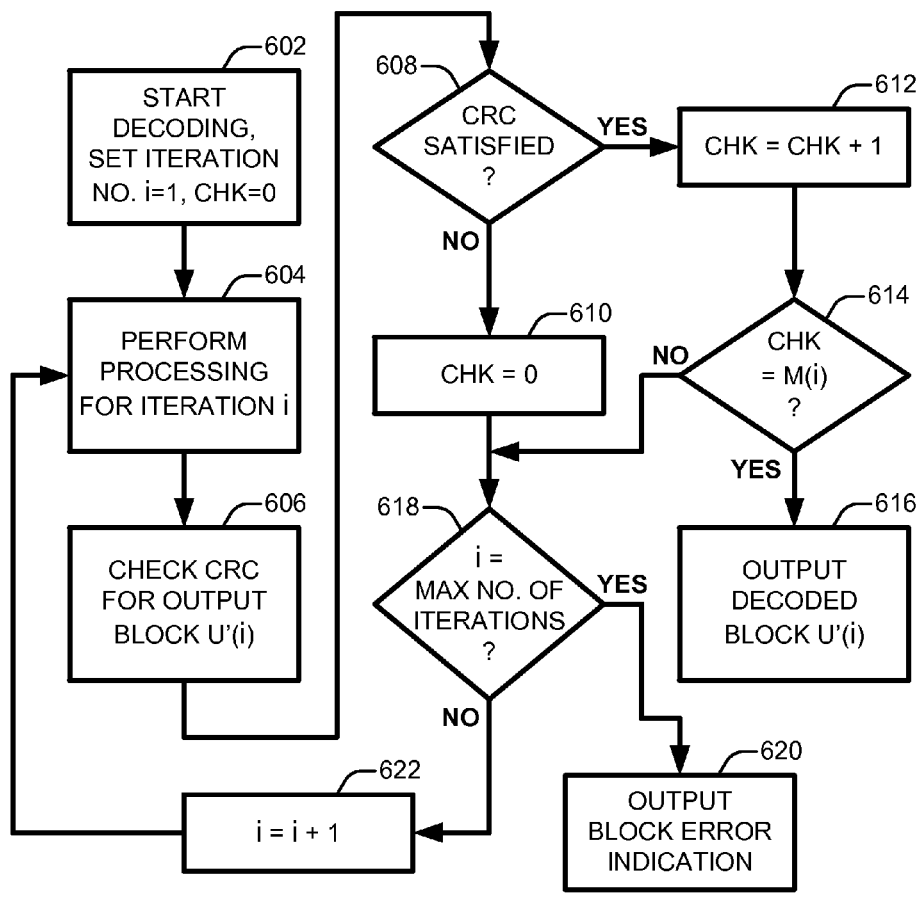
FIG. 6 illustrates an example iterative algorithm for decoding a transport block when each sub-block is associated with a CRC.
Figure 7:
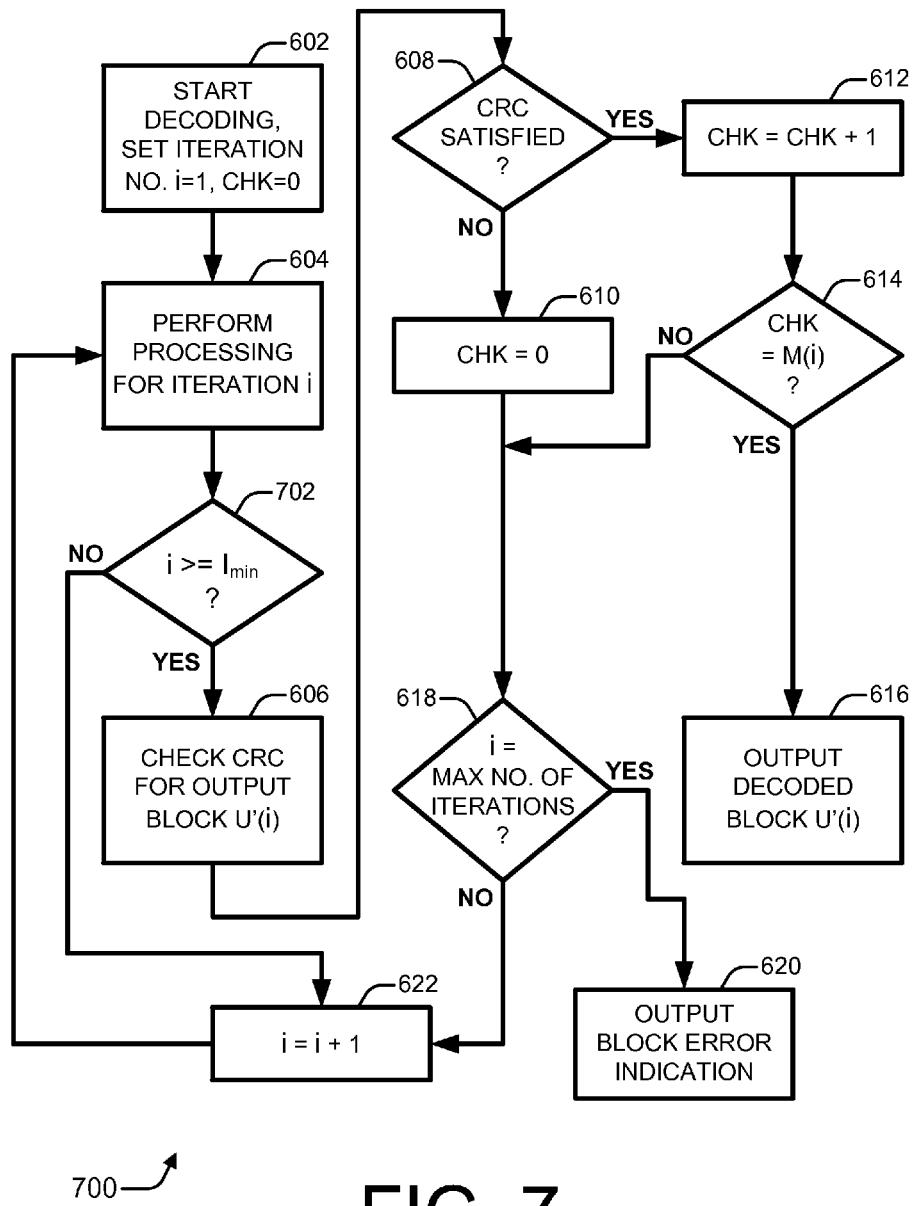
FIG. 7 illustrates an alternative example iterative algorithm for decoding a transport block when each sub-block is associated with a CRC.
Figure 8:
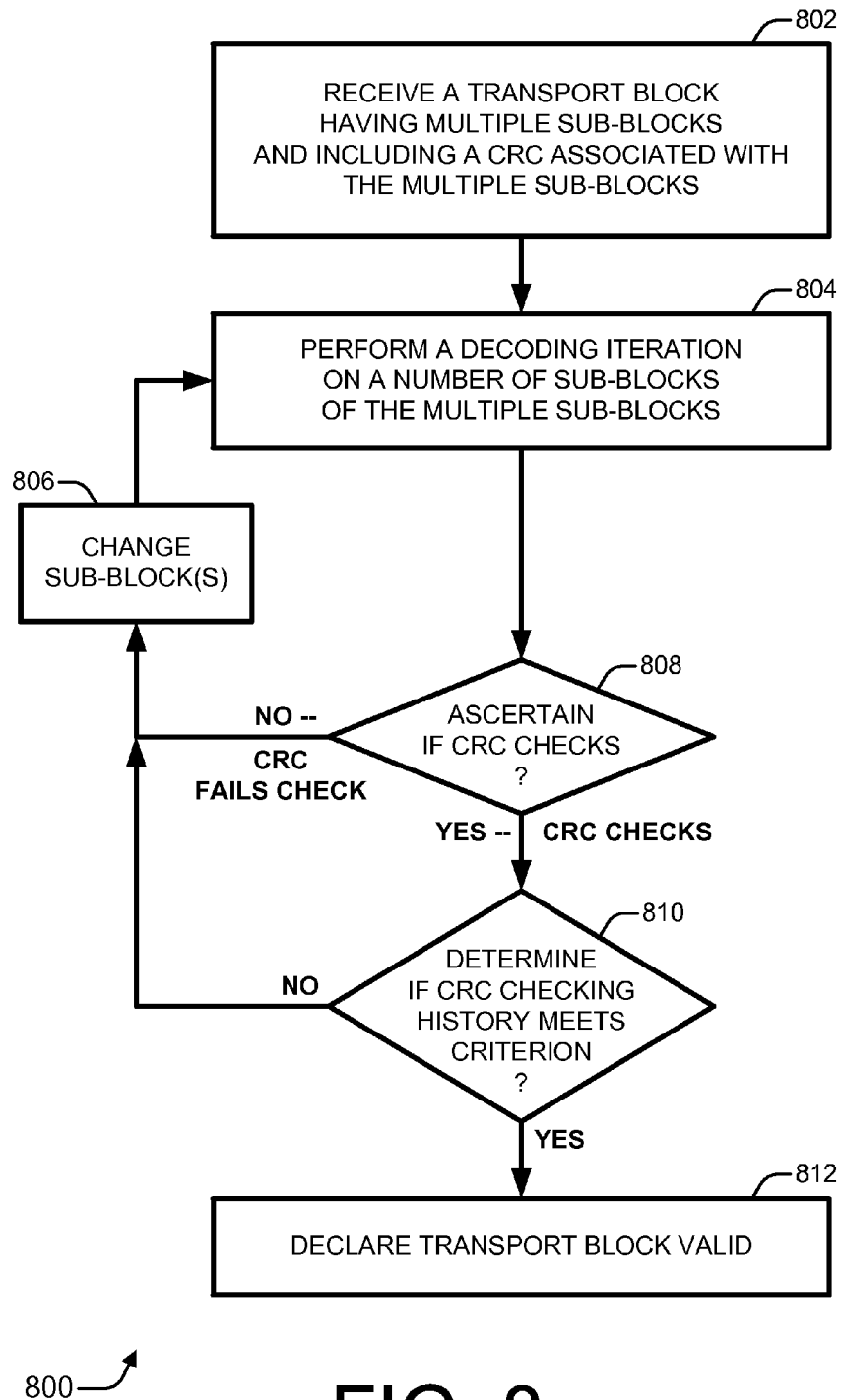
FIG. 8 is a flow diagram of an example general method for iterative decoding of a transport block having a CRC when multiple sub-blocks are associated with the CRC.
Figure 9:
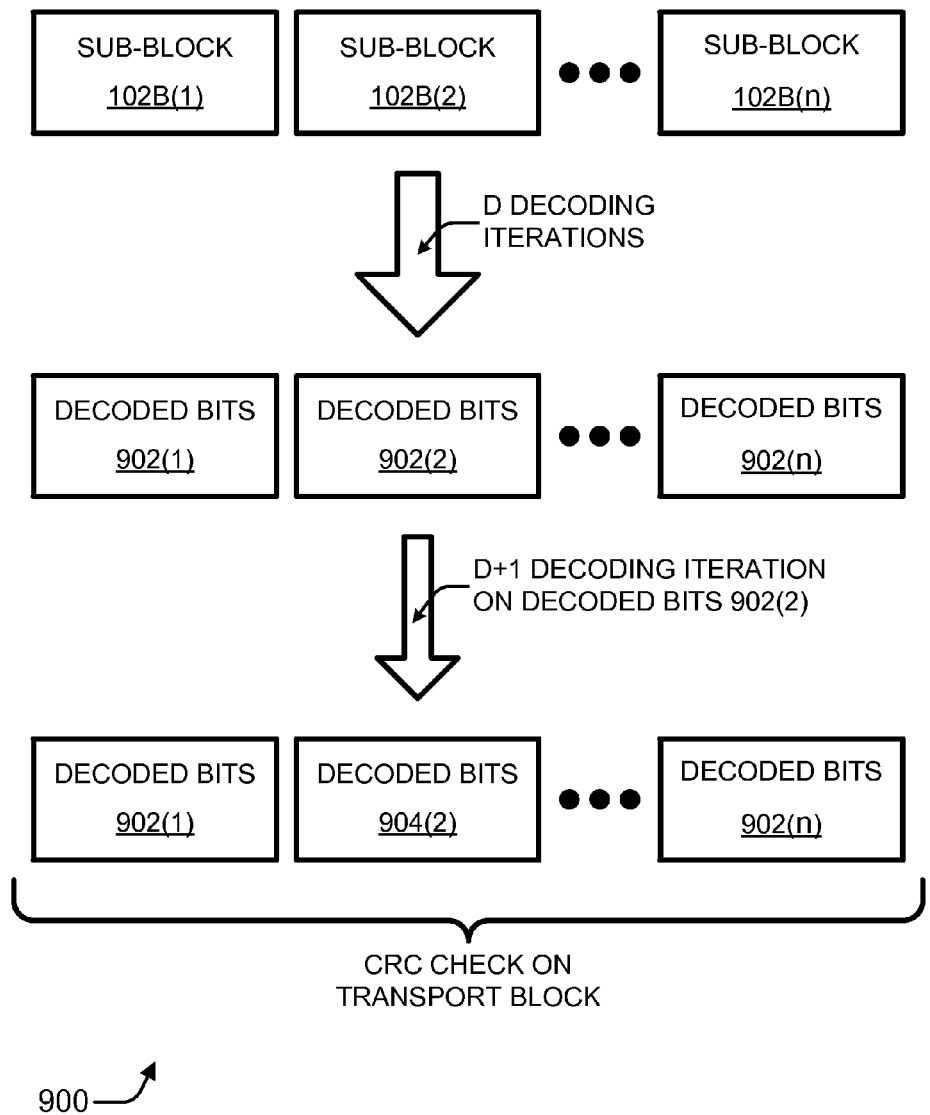
FIG. 9 is a block diagram illustrating an example concatenation of decoded bits between iterations when decoding a transport block having a CRC when multiple sub-blocks are associated with the CRC.

Two example sets of embodiments are described herein below. A first set of example embodiments is directed to transport blocks 100A (of FIG. 1A) having multiple sub-blocks 102A with respective inner CRCs 104 covering each sub-block 102A in addition to an outer CRC 106 that covers the entirety of the transport block. A second set of example embodiments is directed to transport blocks 100B of (FIG. 1B) having multiple sub-blocks 102B and an outer CRC 106 that covers the entirety of the transport block 100B. FIGS. 5-7 illustrate example implementations of the first set of embodiments. FIGS. 8 and 9 illustrate example implementations of the second set of embodiments.

In accordance with the first set of example embodiments, a method uses an inner CRC check on consecutive decoding iterations as a stopping rule to terminate the operation of the decoder. If the inner CRC checks after each of a predetermined number of consecutive iterations, the iterative decoding process is terminated for the sub-block, and the resulting sequence of decoded bits is considered to be correct. The outer CRC is checked with regard to the entirety of the decoded bits of the transport block before the data can be declared as valid. If the number of decoding iterations on a given sub-block exceeds a selected maximum without passing the inner CRC check, the given sub-block is assumed erroneous, which implies that the entire transport block is erroneous also. Early termination of the iterative decoding operations on the individual sub-blocks using the inner CRC helps to reduce the complexity of the decoder significantly. This complexity reduction can lower chip area and power consumption for the iterative decoder.

According to a first aspect, a sub-block is not declared correct until CRC checking indicates the lack of an error for a predetermined number of consecutive iterations (which is denoted by M in example algorithms below). This consecutive CRC stopping rule exhibits a false alarm probability that is effectively zero while also significantly reducing the miss event probability. According to a second aspect, the predetermined number of consecutive CRC checks may be a dependent variable, M(i), that depends on the actual number of decoding iterations that have been performed.

According to a third aspect, the CRC checking results of the first "few" decoding iterations, which is denoted by $I_{min}$, may be ignored with regard to applying the consecutive CRC stopping rule. According to a fourth aspect, a decoding order for the multiple sub-blocks in a transport block may be prioritized to further reduce the overall decoding complexity of a transport block. Respective sub-blocks may be ordered responsive to respective sub-block reliability values and then iteratively decoded based on the prioritized ordering. By way of example only, they may be ordered responsive to their noise variance estimates and then sub-blocks with higher noise variance estimates are decoded first. This, too, can result in a reduction in complexity by on average detecting a transport block error earlier.

For example general embodiments, a method is for iterative decoding of a received block whose information bits are covered by a CRC. Iterations of an iterative decoding process are performed on the block. It is ascertained whether the CRC checks after each iteration. The iterative decoding process for the block is stopped if the CRC checks for a predetermined number of consecutive iterations. Furthermore, the iterative decoding process may be continued if the CRC does not check for the predetermined number of consecutive iterations. In an example implementation, the predetermined number of consecutive iterations of successful CRC checks is a dependent variable that depends on the number of decoding iterations that have been performed.

FIG. 5 is a flow diagram 500 of an example general method for decoding a transport block that is constructed from multiple sub-blocks having associated CRCs. As illustrated, flow diagram 500 includes four blocks 502-508. Flow diagram 500 may be implemented by a device, such as a receiving device 204 (of FIG. 2).

The acts of flow diagram 500, as well as the other flow diagrams described herein, may be effectuated with processor-executable instructions. Processor-executable instructions may be embodied as hardware, firmware, software, fixed logic circuitry, combinations thereof, and so forth. Example operational implementations of processor-executable instructions include, but are not limited to, a memory coupled to a processor, an application-specific integrated circuit (ASIC), a digital signal processor and associated code, some combination thereof, and so forth.

In an example embodiment, flow diagram 500 depicts a method for decoding a transport block constructed from multiple sub-blocks. Each sub-block is a code word that may be decoded iteratively with the information bits thereof being covered by a CRC. The method includes acts of receiving, performing, stopping, and continuing. At block 502, the transport block is received. At block 504, one iteration of an iterative decoding process on a particular sub-block of the multiple sub-blocks is performed. It may be ascertained whether the CRC for the particular sub-block checks after each iteration.

At block 506, the iterative decoding process for the particular sub-block is stopped if the CRC associated with the particular sub-block checks for a predetermined number of consecutive decoding iterations. At block 508, the iterative decoding process for other sub-blocks for which the iterative decoding process has not been stopped are continued until decoding iterations for all sub-blocks of the multiple sub-blocks can be stopped. Also, in an example implementation, the iterative decoding process is performed one sub-block at a time before proceeding to the next sub-block of the multiple sub-blocks.

FIG. 6 illustrates an example iterative algorithm 600 for decoding a transport block when each sub-block is associated with a CRC. With iterative algorithm 600, decoding is started at step 602. The iteration count is set to i=1, and the current number of successful consecutive checks is set to CHK=0. At step 604, processing for iteration i is performed. At step 606, the CRC for the output block U'(i) is checked. At step 608, it is ascertained if the CRC is satisfied. If not, then the successful consecutive check counter is reset to CHK=0 at step 610.

If the CRC does check (as ascertained at step 608), then at step 612 the successful consecutive check counter is incremented with CHK=CHK+1. At step 614, it is verified if the successful consecutive check counter equals the predetermined number of successful consecutive checks (dependent) variable M(i). If the consecutive CRC stopping rule is verified (at step 614), then at step 616 the decoded block U'(i) is output.

After step 610 or after a negative determination at step 614, the algorithm continues at step 618. At step 618, it is determined if the maximum number of decoding iterations have been performed. If so, then at step 620 a block error indication is output. If not, then the iteration count is incremented with i=i+1 at step 622.

Thus, for certain example embodiments, the iterative decoding process is not stopped until M(i) consecutive CRC checks have been satisfied. The variable M(i) in algorithm 600 is a dependent variable. It refers to the number of successive iterations for which the CRC is to have been satisfied at iteration i for decoding iterations to stop. Example alternative implementations for these embodiments are described below:

In one alternative implementation, the predetermined number of consecutive iterations, which is denoted by M(i) in FIG. 6, for which the CRC is to be satisfied does not vary with the current number of iterations. For instance, M may be selected as a fixed constant having a predetermined fixed value (e.g., 2, 3, etc.).

In another alternative implementation, the predetermined number of consecutive successful checks M(i) may decrease as the iteration count i increases. For example, M(i) may be set to 3 when i<=3 (i.e., for the first two iterations), be set to 2 when i>3, and possibly set to 1 when i=$I_{max}$. The rationale for decreasing the predetermined number of consecutive successful checks M(i) is that the reliability of the decoder output becomes successively higher with the increasing iteration count. That is, the probability of a result for the CRC check at iteration i+1 being the same as the result for the CRC check at iteration i, increases as i increases. This leads to successive CRC checks becoming progressively less relevant inasmuch as they provide little additional information.

An alternative area of application for which the principles of the invention may be used is a multi-pass equalizer/decoder in which the equalization and channel decoding operations are applied iteratively in order to improve the overall receiver performance. In such applications, a consecutive CRC stopping rule as described herein may be used to reduce the miss probability while also reducing complexity.

FIG. 7 illustrates an alternative example iterative algorithm 700 for decoding a transport block when each sub-block is associated with a CRC. With algorithm 700, the consecutive CRC check stopping rule is applied after a minimum number of decoding iterations, denoted by $I_{min}$, have been performed. For instance, $I_{min}$ may be set to 2, 3, etc. Algorithm 700 differs from algorithm 600 (of FIG. 6) by the addition of step 702. At step 702, it is determined if at least the minimum number of decoding iterations $I_{min}$ have been performed. If so, the algorithm continues to step 606 to check the CRC. If at least $I_{min}$ decoding iterations have not been performed, then the algorithm proceeds to step 622 to increment the iteration counter i.

In certain real-world implementations, the CRC checking circuits may be tightly integrated into a given iterative decoder structure. It may therefore not be possible to completely avoid performing CRC checking for the initial iterations. In such configurations, however, the CRC checking result can be ignored until the number of performed decoding iterations reaches $I_{min}$.

In certain example embodiments, the multiple sub-blocks of a received transport block may be prioritized based on sub-block reliability values. The iterative decoding process on the multiple sub-blocks may then be performed in an order that is responsive to the sub-block reliability values. This can reduce the overall complexity of an iterative decoder.

When a transport block is segmented into multiple sub-blocks (as shown in FIGS. 1A and 1B), an error in any one of the sub-blocks renders the whole transport block invalid. Consequently, it is unnecessary to continue decoding the remaining sub-blocks of the transport block when one is confirmed to be in error. When an overall transport block is in error, detecting a constituent sub-block that is in error earlier helps reduce complexity.

In order to increase the probability that transport blocks in error are detected earlier, sub-blocks can be sorted in, e.g., decreasing order of corresponding signal reliability. In other words, they may be sorted and prioritized based on sub-block reliability values. For example, sub-blocks may be sorted according to their signal-to-noise ratios or their signal-to-noise-and-interference ratios. As another example, sub-blocks may be sorted according to their noise variance estimates or their noise-and-interference power estimates.

The second set of example embodiments are applicable to transport blocks in which the sub-blocks do not have individual check sequences (e.g., as shown in FIG. 1B). In other words, there are no inner CRCs. There is an outer CRC that provides a check sum over the entirety of the data block. A straightforward approach to handle this transport block scheme is to complete turbo decoding operations on all sub-blocks (using the maximum number of iterations), and finally perform the frame check on the entire sequence to determine if the data of the transport block was received correctly or erroneously.

In contrast to such a "straightforward" approach and in accordance with the second set of example embodiments, described methods can reduce the complexity of an iterative decoder using the outer CRC. In an example implementation, a limited number of decoding iterations are performed on each sub-block before checking the CRC. The iterative decoding process is continued if the CRC does not check, but it may be stopped if the CRC does check.

Generally, example embodiments entail ascertaining if a CRC checks on the entirety of a transport block after each decoding iteration on a sub-block. After a predetermined number of correct CRC checks, the iterative decoding process may be terminated. The sub-blocks may also be prioritized to determine on which sub-block the next decoding iteration is to be applied. Additional details as well as alternative implementations are described further herein below.

In certain example embodiments, there are methods for decoding a transport block that includes multiple sub-blocks, each of which can be decoded iteratively. The transport block also includes a single CRC over an entirety of the transport block. The methods include acts of performing a decoding iteration on a particular sub-block and checking the CRC for the entirety of the transport block. A first example method also includes an act of performing a decoding iteration on a different sub-block. A second example method also includes an act of terminating the decoding iterations for all of the sub-blocks of the multiple sub-blocks.

More specifically, a decoding iteration is performed on a particular sub-block of the multiple sub-blocks. The CRC for the entirety of the transport block is checked using decoded bits obtained from the decoding iteration on the particular sub-block and decoded bits obtained from previous decoding iterations on other sub-blocks of the multiple sub-blocks. In the first example method, a decoding iteration is performed on a different sub-block if the CRC does not check. Furthermore, the decoding iterations for all of the sub-blocks of the multiple sub-blocks may be terminated if the CRC checks consecutively for a predetermined number of consecutive decoding iterations. The predetermined number of consecutive iterations may be set, for example, as low as one.

FIG. 8 is a flow diagram 800 of an example general method for iterative decoding of a transport block having a CRC when multiple sub-blocks are associated with the CRC. As illustrated, flow diagram 800 includes six steps 802-812. Flow diagram 800 may be implemented by a device, such as a receiving device 204 (of FIG. 2). In an example embodiment, flow diagram 800 depicts a method for a receiving device that iteratively decodes a transport block. The method includes acts of receiving, performing, ascertaining, and performing conditionally on the ascertaining At step 802, a transport block having multiple sub-blocks is received. The transport block includes a CRC that is associated with the multiple sub-blocks. The multiple sub-blocks number "n". At step 804, a decoding iteration is performed on a number of sub-blocks of the multiple sub-blocks, with the number being greater than zero and less than "n".

At step 808, it is ascertained if the CRC checks with regard to the multiple sub-blocks. If the CRC check fails, the sub-blocks to be decoded are changed at step 806. Thus, at step 804, the decoding iteration is performed on at least one different sub-block of the multiple sub-blocks if the CRC is not ascertained to check (at step 808).

If, on the other hand, the CRC is ascertained to check (at step 808), the transport block may be declared valid at step 812. Additionally, the declaration of validity may be conditional on a CRC checking history meeting a criterion. When repeated successful CRC checks are used as part of a stopping rule, the act(s) of step 810 are also performed after an affirmative CRC check at step 808.

At step 810, if the CRC is ascertained to check, decoding iterations are repeatedly performed on one or more sub-blocks until a CRC checking history is determined to meet a predetermined criterion. The predetermined criterion may be, for example, that the CRC checks a predetermined total number of times or that the CRC checks a predetermined consecutive number of times.

As another example alternative implementation, the transport block may be declared invalid if a predetermined number of decoding iterations are performed on each sub-block of the multiple sub-blocks without the CRC checking.

In another example embodiment, a device is adapted to iteratively decode a transport block having a CRC. The device includes a receiver, a decoder, and a processor. The receiver receives a transport block having multiple sub-blocks. The transport block includes a CRC that is associated with the multiple sub-blocks. The decoder decodes a subset of the multiple sub-blocks. The subset is one or more sub-blocks but fewer than all of the multiple sub-blocks. The processor is programmed to ascertain if the CRC checks with regard to the multiple sub-blocks after the subset is decoded by the decoder. The processor is also programmed to cause the decoder to continue to iteratively decode subsets of the multiple sub-blocks if the CRC does not check after a subset is decoded.

In an example implementation, the processor is further programmed to ascertain if the CRC checks with regard to the multiple sub-blocks by checking decoded bits that are concatenated from a current decoding iteration on the subset of the multiple sub-blocks and decoded bits from one or more previous decoding iterations on other sub-blocks of the multiple sub-blocks. The concatenation of decoded bits during the iterative decoding process is described below with particular reference to FIG. 9.

By way of example but not limitation, operation of a turbo encoder and a turbo decoder are described. Each sub-block of bits U is passed through the turbo encoder and a resulting stream of encoded bits is obtained. The encoded bits for each of the sub-blocks are then interleaved, modulated, and sent over the wireless channel to the receiver. A turbo encoder typically includes two constituent encoders. The data bits comprising a sub-block are passed through the first constituent encoder to produce a first set of encoded bits. The data bits are then interleaved and passed through the second constituent encoder to produce a second set of encoded bits. Finally, a process of puncturing is used to choose among the data bits and the two sets of encoded bits to select the final set of encoded bits. This selection is made in accordance with a coding rate and puncturing rules. The final set of encoded bits V is sent over the channel.

The turbo decoder works iteratively with two constituent decoders. It first decodes according to one of the decoders, and this process produces a refined version of the data bits. The refined version of data bits is then passed to the second decoder, with a process of interleaving in between. Successive iterations alternating between the first and second constituent decoders continually refine the current version of the data bits. This process can be continued, e.g., for a certain pre-set number of iterations.

In a straightforward approach, the turbo decoding process can be performed for the allowable maximum number of iterations for all sub-blocks. The data block thus obtained, as the concatenation of the data bits output from the constituent turbo decoders operating on each sub-block, is then passed through the CRC check process. If the check is successful, then the receiver may acknowledge the received data block and pass it on to higher layers. If the check is unsuccessful, the receiver may store the received data block in memory and signal a negative acknowledgment to the transmitter, which may retransmit the data block.

In contrast, for certain example embodiments that are described herein, a CRC check is performed on the data block after the turbo-decoder completes an iteration on a given sub-block. Thus, the turbo decoder is operated for the next scheduled iteration on sub-block m, and the CRC check is performed on the concatenated block that has the decoded bits from sub-block m from the current iteration, but decoded bits from other sub-blocks from previous iterations.

FIG. 9 is a block diagram 900 illustrating an example concatenation of decoded bits between iterations when decoding a transport block having a CRC when multiple sub-blocks are associated with the CRC. Sub-blocks 102B(1), 102B(2) . . . 102B(n) of a received transport block are shown. After D total decoding iterations, a concatenated set of decoded bits is produced. They are illustrated as decoded bits 902(1), 902(2) . . . 902(n).

Another iteration of the decoder (i.e., the D+1 th iteration) is performed on decoded bits 902(2) from original sub-block 102B(2). This produces decoded bits 904(2). The other decoded bits from the previous D iterations (e.g., decoded bits 902(1) and 902(n)) are concatenated with decoded bits 904(2). The CRC is then checked with regard to the entirety of the received transport block using decoded bits 902(1), 904(2), . . . 902(n). Successive decoding iterations and CRC checks may be performed similarly.

If the CRC checks, then there is a relatively good chance that the entire transport block was correctly received. Thus, the decoding can be stopped. If the CRC does not check, then another iteration of the decoder for a different sub-block is performed. After each iteration, the concatenated decoded bits from the various sub-blocks are checked against the CRC with decoded bits from a most recent iteration of the decoder on a sub-block being included with decoded bits from previous iterations on other sub-blocks. Thus, the decoded bits from the latest iteration for each sub-block are concatenated and checked against the CRC with the number of iterations performed on each of the sub-blocks being potentially different at any given moment.

The order may also be prioritized when selecting the next sub-block to be iteratively decoded. Each respective sub-block may be associated with a corresponding sub-block reliability value. Prior to performing an iteration n, the decoded blocks may be prioritized in order of increasing reliability. Sub-blocks with lower reliability values are prioritized for the decoding operation.

Because relatively less reliable sub-blocks are more likely to need relatively more iterations, efficiency may be increased if the next iterations are applied to sub-blocks in order of increasing reliability. Examples of sub-block reliability values include, but are not limited to, different means (such as the average or the minimum value) of the absolute value of the likelihood values across the decoded bits for each sub-block. Other examples of sub-block reliability are soft-decision metrics.

As noted above, instead of a single correct CRC check, multiple correct CRC checks across decoding iterations can be used as a criterion to stop the iterative decoding process. A history of successful and/or failed CRC checks may be maintained. By performing multiple checks, the chance that an incorrect sub-block triggers a successful CRC check is significantly reduced.

In an example implementation, a CRC check may be performed on the estimate of the bits before any decoding operations are performed, and another CRC check may be performed after one iteration on each of the sub-blocks of the transport block. If the CRC checks in both cases, then the decoded block is highly likely to be correct. If the CRC does not check, then the process of decoding prioritized sub-blocks, along with the repeated checking of the CRC, can proceed. A number of correct consecutive CRC checks may be used, for example, as a criterion for stopping the iterative decoding process.

Figure 10:
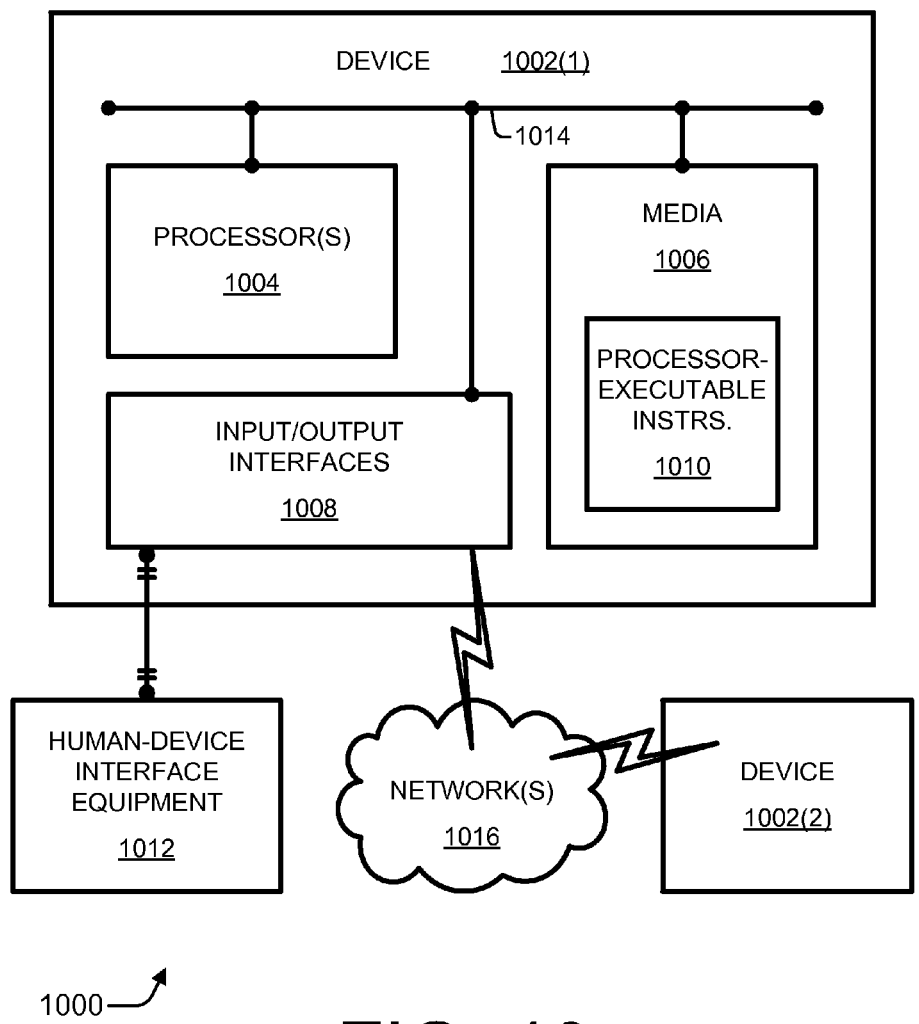
FIG. 10 is a block diagram of example devices that may be used to implement embodiments for iterative decoding of blocks with CRCs.

FIG. 10 is a block diagram 1000 of example devices 1002 that may be used to implement embodiments for iterative decoding of blocks with CRCs. As illustrated, block diagram 1000 includes two devices 1002(1) and 1002(2), human-device interface equipment 1012, and one or more networks 1016. As explicitly shown with device 1002(1), each device 1002 may include at least one processor 1004, one or more media 1006, one or more input/output interfaces 1008, and at least one interconnection 1014. Media 1006 may include processor-executable instructions 1010. Network(s) 1016 may be, by way of example but not limitation, an internet, an intranet, an Ethernet, a public network, a private network, a cable network, a digital subscriber line (DSL) network, a telephone network, a wired network, a wireless network, some combination thereof, and so forth. Device 1002(1) and device 1002(2) may communicate over network(s) 1016.

For example embodiments, device 1002 may represent any processing-capable device. Processor 1004 may be implemented using any applicable processing-capable technology, and one may be realized as a general-purpose or a special-purpose processor. Examples include, but are not limited to, a central processing unit (CPU), a digital signal processor (DSP), a microprocessor, some combination thereof, and so forth. Media 1006 may be any available media that is included as part of and/or is accessible by device 1002. It includes volatile and non-volatile media, removable and non-removable media, storage (e.g., memory) and transmission media (e.g., wireless or wired communication channels), hard-coded logic media (which may include memory), combinations thereof, and so forth. Media 1006 is tangible media when it is embodied as a manufacture and/or as a composition of matter.

Interconnection 1014 interconnects the components of device 1002. Interconnection 1014 may be realized as a bus or other connection mechanism and may directly or indirectly interconnect various components. I/O interfaces 1008 may include (i) a network interface for monitoring and/or communicating across network 1016, (ii) a display device interface for displaying information on a display screen, (iii) one or more human-device interfaces, and so forth. Example network interfaces include, but are not limited to, a radio or transceiver (e.g., a transmitter and/or receiver), a modem, a network card, some combination thereof, and so forth. Human-device interface equipment 1012 may be a keyboard/keypad, a touch screen, a remote, a mouse or other graphical pointing device, a screen, a speaker, and so forth. Human-device interface equipment 1012 may be integrated with or discrete from device 1002

Generally, processor 1004 is capable of executing, performing, and/or otherwise effectuating processor-executable instructions, such as processor-executable instructions 1010. Media 1006 is comprised of one or more processor-accessible media. In other words, media 1006 may include processor-executable instructions 1010 that are executable by processor 1004 to effectuate the performance of functions by device 1002. Processor-executable instructions 1010 may be embodied as software, firmware, hardware, fixed logic circuitry, some combination thereof, and so forth. Processor 1004 and processor-executable instructions 1010 of media 1006 may be realized separately (e.g., as a DSP executing code) or integrated (e.g., as part of an application-specific integrated circuit (ASIC)).

In example implementations, one device 1002 may comprise a transmitting device 202, and another device 1002 may comprise a receiving device 204 (both of FIG. 2). Processor-executable instructions 1010 may comprise, for example, iterative decoder 216 of FIG. 4. When processor-executable instructions 1010 are executed by processor 1004, the functions that are described herein may be effectuated. Example functions include, but are not limited to, those illustrated by flow diagrams 500/800 and algorithms 600/700, as well as those pertaining to features illustrated by the various procedures, schemes, and so forth.

Although example embodiments have been described in the context of iterative processing for channel decoding, it is apparent that iterative processing occurs in many other situations in wired and wireless communications systems. Thus, the principles that are described herein are also applicable to these other situations.

Different embodiment(s) of the invention can offer one or more advantages. Generally, the complexity of a communication device (e.g., a mobile device or base station) may be reduced by enabling the appropriately-early termination of iterative decoding of sub-blocks of a transport block. Also, faster operation of a, e.g., turbo decoding process may be achieved due to early termination. The early termination can enable lower chip area and power consumption.

The devices, acts, features, functions, methods, schemes, data structures, procedures, components, etc. of FIGS. 1A-10 are illustrated in diagrams that are divided into multiple blocks and other elements. However, the order, interconnections, interrelationships, layout, etc. in which FIGS. 1A-10 are described and/or shown are not intended to be construed as a limitation, and any number of the blocks and/or other elements may be modified, combined, rearranged, augmented, omitted, etc. in any manner to implement one or more systems, methods, devices, media, apparatuses, arrangements, etc. for iterative decoding of blocks with cyclic redundancy checks.

Although multiple embodiments of the present invention have been illustrated in the accompanying Drawings and described in the foregoing Detailed Description, it should be understood that the invention is not limited to the disclosed embodiments, for it is also capable of numerous rearrangements, modifications and substitutions without departing from the scope of the invention as set forth and defined by the following claims.

What is claimed is:

1. A method for decoding a transport block including multiple sub-blocks, each of which can be decoded iteratively, wherein the transport block also includes a single cyclic redundancy check, CRC, over an entirety of the transport block; the method comprising acts of:
   performing a decoding iteration on a particular sub-block of the multiple sub-blocks;
   checking the CRC for the entirety of the transport block using decoded bits obtained from the decoding iteration on the particular sub-block and decoded bits obtained from a most recent decoding iteration on other sub-blocks of the multiple sub-blocks; and
   performing a decoding iteration on a different sub-block if the CRC does not check.

2. A method for decoding a transport block including multiple sub-blocks, each of which can be decoded iteratively, wherein the transport block also includes a single cyclic redundancy check, CRC, over an entirety of the transport block; the method comprising acts of:
   performing a decoding iteration on a particular sub-block of the multiple sub-blocks;
   checking the CRC for the entirety of the transport block using decoded bits obtained from the decoding iteration on the particular sub-block and decoded bits obtained using a most recent decoding iteration on other sub-blocks of the multiple sub-blocks; and
   terminating the decoding iterations for all of the sub-blocks of the multiple sub-blocks if the CRC checks consecutively for a predetermined number of consecutive decoding iterations.

3. The method as recited in claim 2 wherein the consecutive decoding iterations may be on different sub-blocks of the multiple sub-blocks.

4. The method as recited in claim 2, wherein the acts of checking and terminating are skipped until after a predetermined minimum number of the decoding iterations have been performed on the particular sub-block.

5. The method as recited in claim 2, wherein the act of terminating is skipped until after the acts of performing and checking have been implemented a predetermined minimum number of times.

6. A method for iterative decoding of a transport block having a cyclic redundancy check, CRC, the method comprising acts of:
   receiving a transport block having multiple sub-blocks, the transport block including a CRC associated with the multiple sub-blocks;
   performing a decoding iteration on a number of sub-blocks of the multiple sub-blocks;
   ascertaining if the CRC checks with regard to the multiple sub-blocks; and
   performing the decoding iteration on at least one different sub-block of the multiple sub-blocks if the CRC is not ascertained to check.

7. The method as recited in claim 6, further comprising an act of:
   performing the decoding iteration on each of the sub-blocks of the multiple sub-blocks at least once prior to performing the act of ascertaining.

8. The method as recited in claim 6, wherein the number of sub-blocks for the act of performing a decoding iteration on a number of sub-blocks equals one.

9. The method as recited in claim 6, further comprising an act of:
   if the CRC is ascertained to check, declaring the transport block valid.

10. The method as recited in claim 6, further comprising an act of:
    if the CRC is ascertained to check, repeatedly performing the decoding iterations on one or more sub-blocks until a CRC checking history is determined to meet a predetermined criterion.

11. The method as recited in claim 10, wherein:
    the CRC checking history is determined to meet the predetermined criterion if the CRC checks a predetermined total number of times; or
    the CRC checking history is determined to meet the predetermined criterion if the CRC checks a predetermined consecutive number of times.

12. The method as recited in claim 10, further comprising an act of:
    declaring the transport block invalid if the CRC checking history is not determined to meet the predetermined criterion.

13. The method as recited in claim 6, further comprising an act of:
    declaring the transport block invalid if a predetermined number of decoding iterations are performed on each sub-block of the multiple sub-blocks without the CRC checking.

14. A device for iterative decoding of a transport block having a cyclic redundancy check, CRC, the device comprising:

a receiver to receive a transport block having multiple sub-blocks, the transport block including a CRC associated with the multiple sub-blocks;

a decoder to decode a subset of the multiple sub-blocks; and at least one processor programmed to ascertain if the CRC checks with regard to the multiple sub-blocks after the subset is decoded by the decoder, the processor programmed to cause the decoder to continue to iteratively decode other subsets of the multiple sub-blocks if the CRC is not ascertained to check after each of the subsets.

15. The device as recited in claim 14, wherein the decoder comprises a turbo decoder that performs two decoding operations per decoding cycle.

16. The device as recited in claim 15, wherein each iteration of the turbo decoder comprises one decoding operation or two decoding operations.

17. The device as recited in claim 14, wherein the processor is further programmed (i) to prioritize respective ones of the multiple sub-blocks based on respective sub-block reliability values and (ii) to cause the decoder to decode the subsets of the multiple sub-blocks responsive to the sub-block reliability value prioritization.

18. The device as recited in claim 14, wherein the processor is further programmed to ascertain if the CRC checks with regard to the multiple sub-blocks by checking decoded bits that are concatenated from a current decoding iteration on the subset of the multiple sub-blocks and from a most recent decoding iteration for one or more other sub-blocks of the multiple sub-blocks.

19. The device as recited in claim 14, wherein the processor is further programmed to repeatedly decode subsets of the multiple sub-blocks until a CRC checking history is determined to meet a predetermined criterion.

20. The device as recited in claim 19, wherein:
the CRC checking history is determined to meet the predetermined criterion if the CRC checks a predetermined total number of times; or
the CRC checking history is determined to meet the predetermined criterion if the CRC checks a predetermined consecutive number of times.

21. A non-transitory memory storing processor-executable instructions for iterative decoding of a transport block having a cyclic redundancy check, CRC, wherein the processor-executable instructions, when executed, direct a device to perform acts comprising:

receiving a transport block having multiple sub-blocks, the transport block including a CRC associated with the multiple sub-blocks, the multiple sub-blocks numbering "n";

performing a decoding iteration on a number of sub-blocks of the multiple sub-blocks, the number being greater than zero and less than "n";

ascertaining if the CRC checks with regard to the multiple sub-blocks; and performing the decoding iteration on at least one different sub-block of the multiple sub-blocks if the CRC is not ascertained to check.

\* \* \* \* \*